United States Patent [19]

Kogan

[11] Patent Number: 5,321,656
[45] Date of Patent: Jun. 14, 1994

[54] CMOS-BASED PEAK DETECTOR FOR FAST-IN, SLOW-OUT MIN/MAX DETECTION

[75] Inventor: Grigory Kogan, Portland, Oreg.

[73] Assignee: Tektronix, Inc., Wilsonville, Oreg.

[21] Appl. No.: 844,089

[22] Filed: Mar. 2, 1992

[51] Int. Cl.$^5$ .............................................. G11C 13/00
[52] U.S. Cl. ................................. 365/203; 365/189.01
[58] Field of Search .................. 365/149, 203, 189.01, 365/189.04

[56] References Cited

PUBLICATIONS

Article, "Meeting 2-ns Pulse Capture Requirements" Joseph R. Peter Oct. 7, 1985 issue of Nikkei Electronics. pp. 9-12, Figs. 5,6,7.

Primary Examiner—Terrell W. Fears
Attorney, Agent, or Firm—Boulden G. Griffith

[57] ABSTRACT

A fast, CMOS-based peak detection cell circuit and related methods can be used to determine maximum and minimum excursions of a signal being monitored during the very short intervals between high speed sampling points. Two nodes, "a" and "b", of such a circuit are precharged. Node "a" is then connected to the signal to be monitored. A PMOS transistor, with node "a" on its gate and node "b" on its drain, then causes a capacitance at node "b" to discharge to the voltage level of node "a" plus a constant offset voltage. Node "b" thus tracks downward excursions of the signal to be monitored, but not upward ones. Therefore, the voltage level at node "b" at the end of the acquisition interval is a function of the lowest voltage level assumed by the signal. A trio of such minimum detection cell circuits can be used together to find minimum and maximum behaviors of a differential complementary pair of signals. One cell is used to find the minimum of the signal, another the minimum of its complement, and the third the minimum of a common mode signal associated with the signal and its complement. Appropriate subtraction then produces actual signal minimums and maximums. An alternative embodiment for use with longer hold windows has a third node, "c", that is isolated from sub-threshold currents that would otherwise corrupt the analog data over time.

23 Claims, 11 Drawing Sheets

CMOS-BASED PEAK DETECTOR FOR FAST-IN, SLOW-OUT MIN/MAX DETECTION

BACKGROUND OF THE INVENTION

This invention relates to high speed peak detection, and more particularly to a CMOS-based peak detector for finding signal minimums and maximums, e.g., glitches, on a signal during the intervals between successive high speed samples in a fast-in, slow-out data acquisition system.

U.S. Pat. No. 4,271,488 to Saxe for a "High-Speed Acquisition System Employing an Analog Memory Matrix", hereby incorporated by reference, disclosed one version of a high speed analog data acquisition system. Co-pending patent application Ser. No. 07/589,222 by Saxe et al. for an "Analog Acquisition System Including a High Speed Timing Generator", hereby incorporated by reference, describes an improved analog signal acquisition system that is faster than the system described in the '488 patent.

Any method for determining the behavior of an analog signal that is based on sampling the signal at discrete intervals faces the fundamental issue of uncertainty as to the behavior of the signal between samples. The behavior of the signal between samples may nonetheless be of great interest, e.g., if there are glitches on the signal that are causing some sort of problem.

There are digital methods for finding the minimum and maximum behavior of an analog signal, but they also leave gaps between samples and the behavior of the signal within those gaps is still undetermined. However, if the signal can be sufficiently oversampled to ensure capture of the transient events of interest, such approaches can appear to be continuous relative to lower bandwidth activity. In one of these digital methods, two registers are used to store the output of an analog-to-digital converter. A digital comparator monitors the contents of the two registers and retains, for example, the larger value, while enabling the other register to store the next incoming sample. For a "max" detector, the smaller sample is always discarded and the larger one retained. Thus, the largest value received so far is always saved in one register, while the other register is made available for storing the next incoming value. The result is that the largest value found during a sampling period ends up stored in one or the other of the two registers at the end of the period and that register is then selected for readout. Speed increases can be achieved by interleaving several such max (or min) monitors and selecting the most extreme of their outputs as the maximum-max at the end of the sampling period. However, for high frequency signals and/or very fast transients sufficient oversampling is either technically infeasible or prohibitively expensive.

In analog data acquisition systems implemented using analog circuitry and bipolar transistors and diodes there is a convenient way to determine signal minimums and maximums. A diode and capacitor can be arranged to store the largest voltage signal that appears on the input within a sample interval. Using two such diode/capacitor circuits in alternation, one can be used to monitor the signal while the other is being read out and cleared to prepare it for its turn at monitoring the signal.

Complementary Metal Oxide on Semiconductor (CMOS) transistor technology provides some advantages over bipolar transistor technology. In particular, circuitry implemented in CMOS is less expensive, more dense, and uses less power than comparable circuitry implemented in bipolar transistors. However, MOS transistors are slower than bipolar ones, and must be configured differently in order to achieve high bandwidth operation.

SUMMARY OF THE INVENTION

According to one aspect of the invention, two nodes, "a" and "b", of a circuit are connected to $V_{dd}$ during a precharge interval, after which they are disconnected. An acquire signal then controls a switch to connect node "a" to the signal to be monitored during the time interval that the acquire signal is active. A PMOS transistor, with node "a" on its gate and node "b" on its drain, then causes a capacitance at node "b" to discharge to the voltage level of node "a" plus a constant offset voltage equal to the threshold of the PMOS transistor. Node "b" thus tracks downward excursions of the signal to be monitored, but not upward ones. Therefore, the voltage level at node "b" at the end of the acquisition interval is a function of the lowest voltage level assumed by the signal during the time interval that node "a" is connected to the signal to be monitored. At the end of the interval, node "a" is disconnected from the signal, and the voltage level on node "b" is a stored indication of the minimum voltage level of the signal plus the constant offset. A precharge signal then connects node "a" to $V_{dd}$ again to disable $Q_4$. Then the value stored on node "b" is transferred out by a buffer amplifier having node "b" on its input. Following this transfer interval, a clear signal connects node "b" to $V_{dd}$, so that node "b" is again charged to $V_{dd}$ and one acquisition cycle is complete.

According to another aspect of the invention, a trio of minimum detection cell circuits can be used together to find minimum and maximum behaviors of a differential complementary pair of signals. One cell is used to find the minimum of the signal, another the minimum of its complement, and the third the minimum of a common mode signal associated with the signal and the signal's complement. The maximum is found by subtracting the minimum of the signal complement from the minimum of the common mode signal. The minimum is found by subtracting the minimum of the common mode signal from the minimum of the signal. Thus, the present invention provides fast, CMOS-based peak detection of maximums and minimums of an analog signal being monitored during the very short time intervals between the points at which high speed analog sampling occurs.

According to another aspect of the invention, one node "a" of a circuit is discharged to ground and another node "b" is precharged to $V_{dd}$ during a precharge interval. During a clearing interval within the precharge interval, a third node "c" is also precharged to $V_{dd}$. All three nodes are then disconnected from these references and isolated. An acquire signal then controls a switch to connect node "a" to the signal to be monitored during the time interval that the acquire signal is active. An NMOS transistor, with node "a" on its gate and node "b" on its drain, then causes node "b" to inversely follow changes in the voltage on node "a". A diode connects node "c" to node "b" in such a manner as to cause node "c" to discharge to the level of node "b" plus the characteristic (forward biased) junction voltage of the diode. Feedback from node "c" causes a delayed "bounce" in the voltage on node "b", so that the voltage across the diode is less than the characteristic junction voltage and sub-threshold leakage currents are avoided. The voltage level at node "c" at the end of the acquisition interval is the inverse of the maximum voltage level assumed by the signal during the time interval that node "a" is connected to the signal to be monitored. Precharge and clear signals restore the circuit to its initial condition after the final voltage level at node "c" is transferred out though a buffer amplifier. This version of the invention is especially well-suited to long hold window applications, where sub-threshold leakage currents might otherwise corrupt the min/max data before the end of the monitoring interval.

DETAILED DESCRIPTION

Figure 1A:
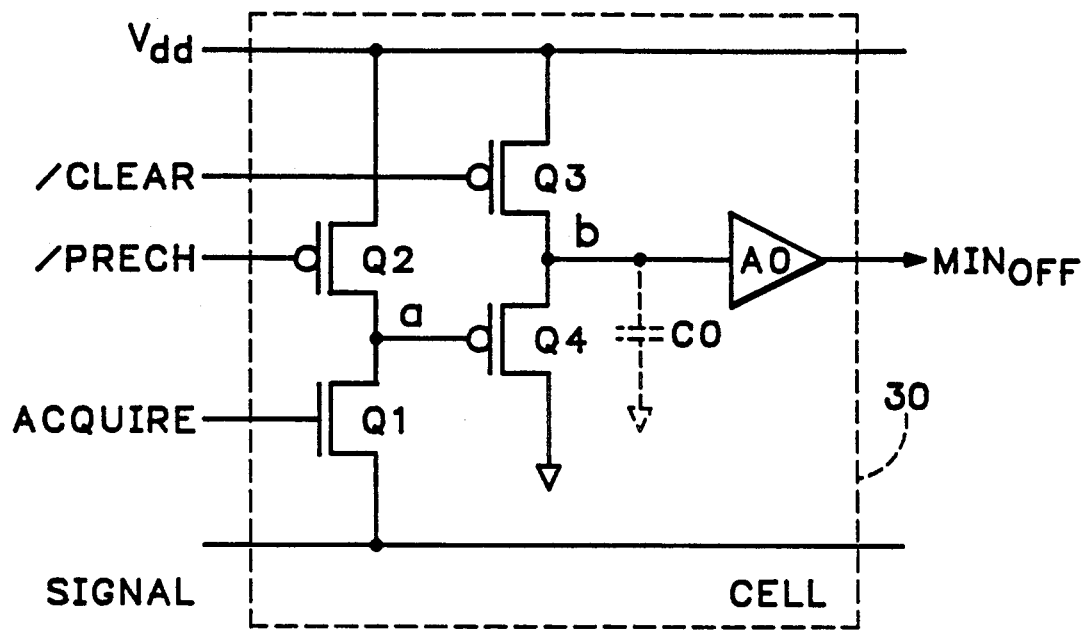
FIGS. 1A–1D are schematic diagrams of four versions of $MIN_{OFF}$ detection cell circuits according to the present invention.

FIG. 1A is a schematic diagram of a MIN (minimum) level detection circuit, or "Cell" 30, according to the present invention. It consists of four MOS FET transistors, Q1 through Q4, and a buffer amplifier A0 which has an input capacitance C0. Q1 is an NMOS transistor, while Q2, Q3 and Q4 are PMOS transistors. The drains of Q2 and Q3 are connected directly to $V_{dd}$. The source of Q4 is connected to ground ($V_{SS}$), while the source of Q1 is connected to a SIGNAL whose behavior is to be monitored. The drain of Q1 is connected to the source of Q2 and to the gate of Q4, and is labeled node "a". The drain of Q4 is connected to the source of Q3 and to the input of the buffer amplifier A0, and is labeled node "b". The output, $MIN_{OFF}$, is taken from the output of the buffer amplifier A0.

Figure 2:
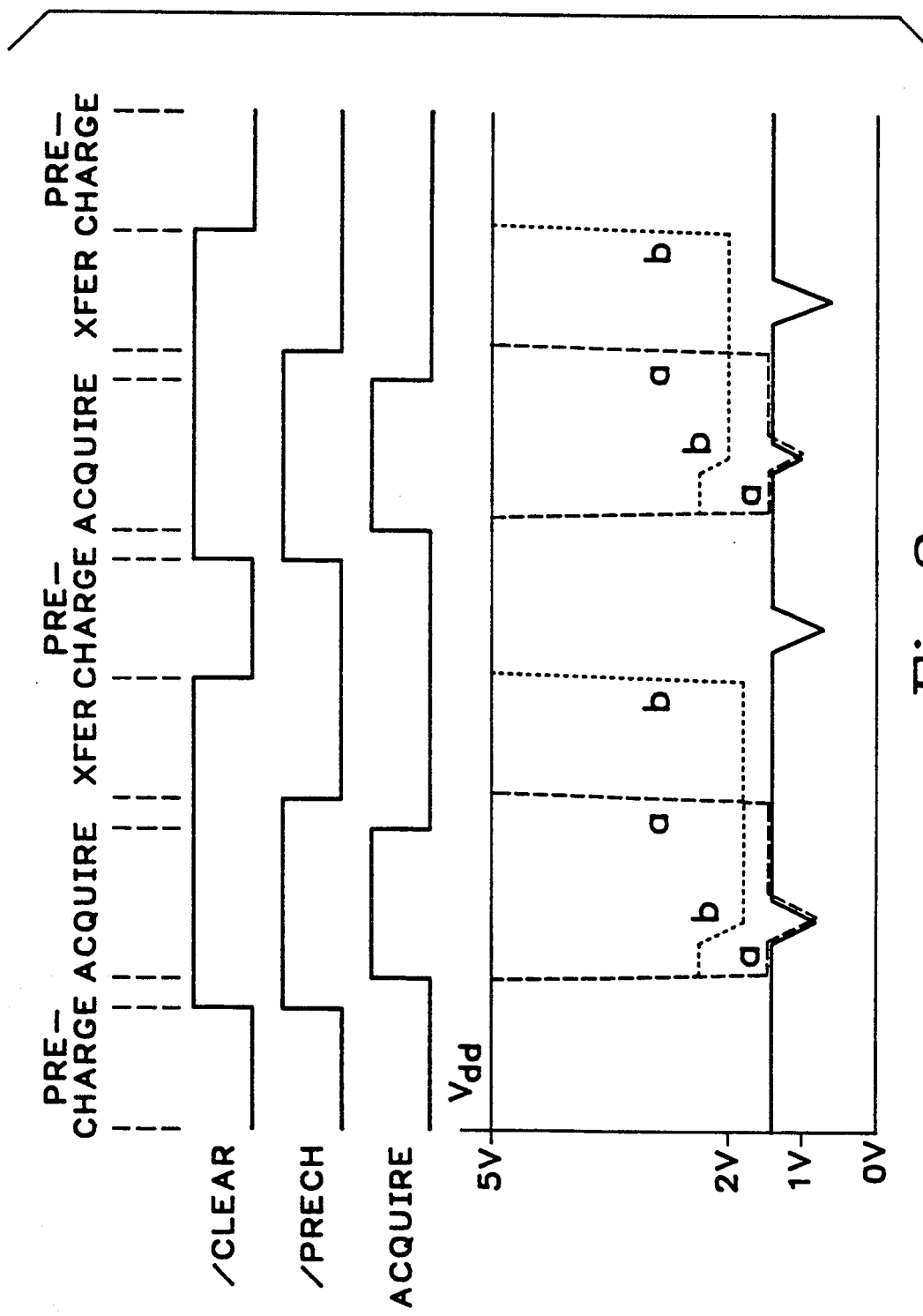
FIG. 2 is a timing diagram illustrating the operation of the $MIN_{OFF}$ detection cell circuits shown in FIGS. 1A–1D.

Referring to FIGS. 1A and 2, during a precharge interval the signals /PRECH (not-precharge), /CLEAR (not-clear), and ACQUIRE are all low. The low signals on the gates of transistors Q2 and Q3 turn those transistors on, connecting nodes "a" and "b" to $V_{dd}$ and charging C0. The low on the gate of transistor Q1, which has the opposite polarity from Q2 and Q3, keeps it turned OFF, isolating node "a" from the SIGNAL being monitored.

At the end of the precharge interval /PRECH and /CLEAR go high turning off transistors Q2 and Q3 and isolating nodes "a" and "b" from $V_{dd}$. At the beginning of an acquisition interval, the ACQUIRE signal on the gate of transistor Q1 goes high, turning it on and connecting node "a" to the SIGNAL being monitored. During the time that the ACQUIRE signal is high, node "a" (the dashed line in FIG. 3) tracks the SIGNAL. Due to the approximate 1 Volt threshold of transistor Q4, node "b" (dotted line) tracks node "a" plus 1 Volt as long as node "a" moves lower in voltage. However, when the SIGNAL and node "a" start to increase in voltage, node "b" cannot follow, but rather retains the lowest voltage that it was discharged to as it followed node "a" down.

At the end of the acquisition interval, ACQUIRE goes low and node "a" is isolated from the SIGNAL. Shortly thereafter, /PRECH goes low and node "a" is again connected to $V_{dd}$. During the ensuing transfer interval, the $V_{dd}$ level on the gate of Q4 keeps that transistor turned off and node "b" (C0) isolated from ground, while the continuing high /CLEAR signal on the gate of Q3 keeps that transistor shut off and node "b" isolated from $V_{dd}$. The voltage level at node "b", $MIN_{OFF}$, is transferred during this interval, as will be further described below.

At the end of the transfer interval, /CLEAR goes low and node "b" is again connected to $V_{dd}$, readying the circuit for its next cycle of operation. Notice (in FIG. 2) that the activity of the SIGNAL is effectively ignored during the transfer and precharge intervals.

Figure 1B:
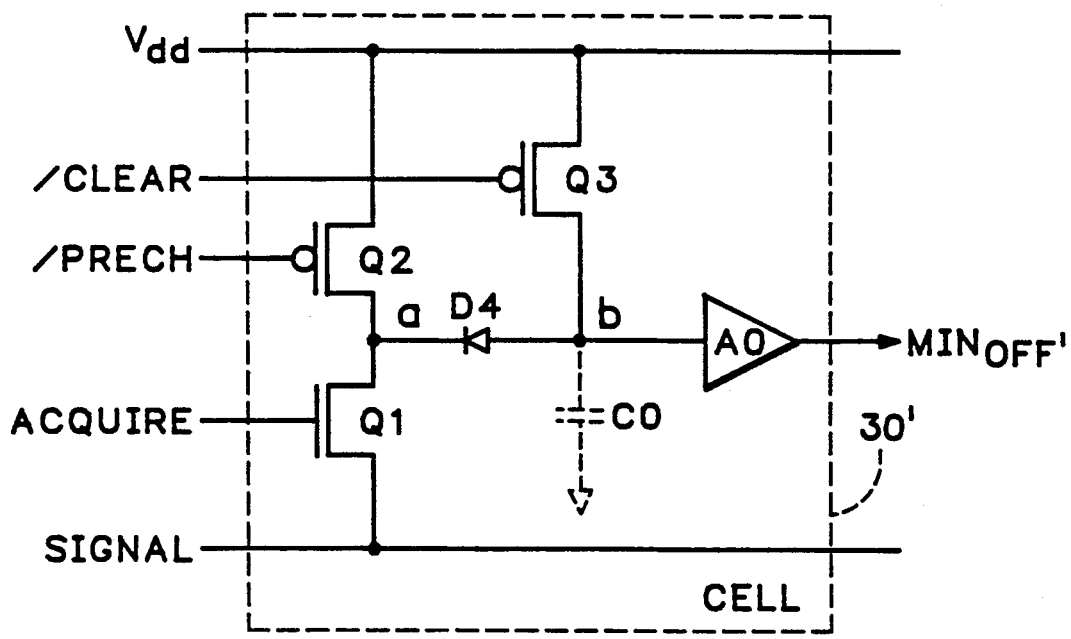
Figure 3:
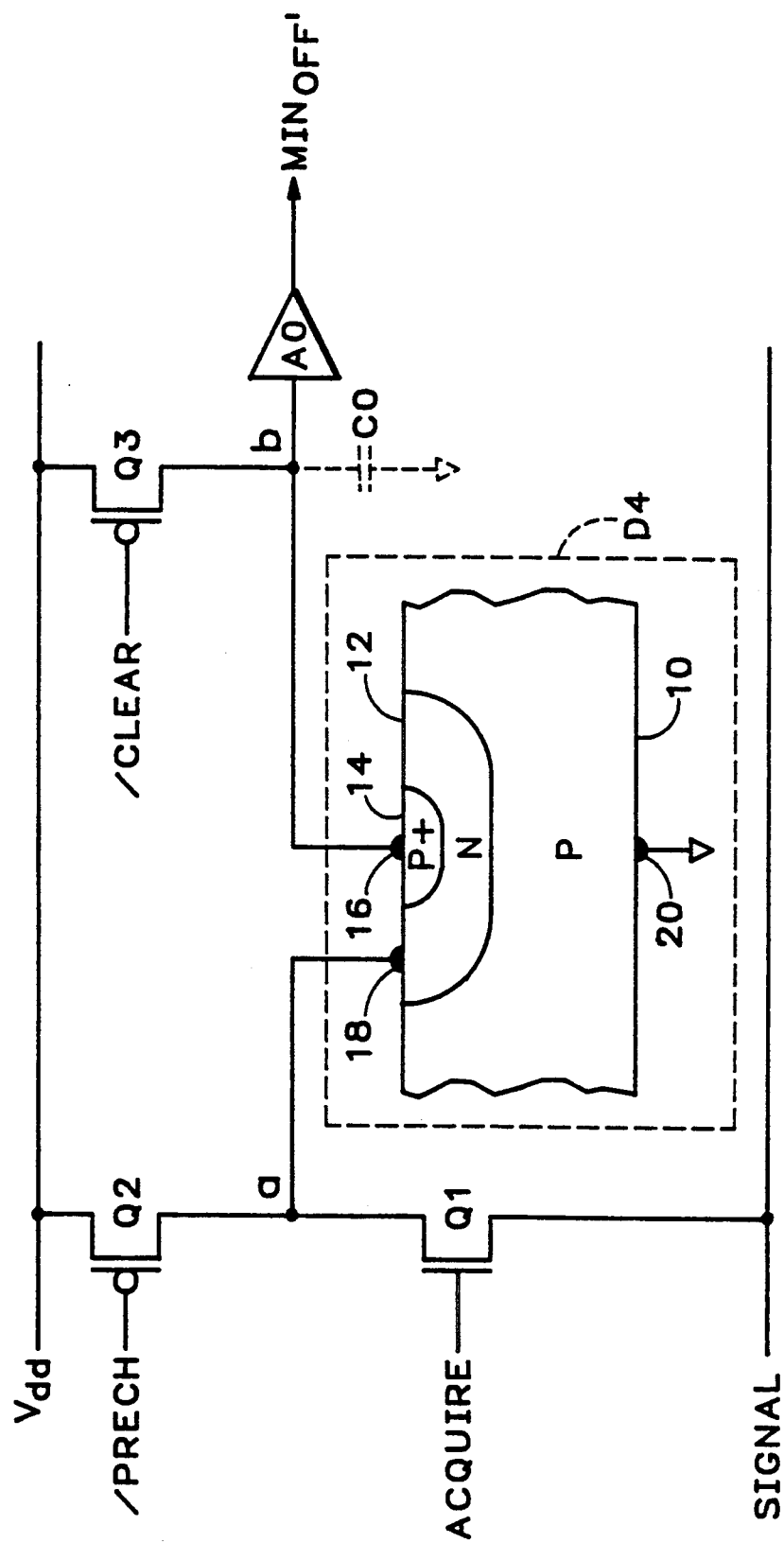
FIG. 3 is a mixed schematic diagram and cross-sectional view of the interior of the MOS-based diode shown in FIG. 1B.

Referring to FIG. 1B, transistor Q4 in FIG. 1A can be replaced by a diode D4 fabricated in CMOS technology if certain precautions are taken. In all other respects the circuitry of FIG. 1B is identical to the circuitry of FIG. 1A. Referring to FIG. 3, the diode D4 is shown fabricated in MOS technology. A substrate 10 is made of P type material. A region of N type diffusion material produces a well 12. A layer of P+ type diffusion material 14 on top of the well 12 produces a P+/N junction forming a diode. Contact 18 connects the cathode of this diode to node "a" and contact 16 connects the anode of this diode to node "b" of the circuit. The offset of the output of this circuit, $MIN_{OFF}$, is approximately 0.7 Volts, instead of the approximately 1.0 Volt offset of the outputs in FIGS. 1A, 1C, and 1D.

From the cross-sectional view of D4 shown in FIG. 3 it can be seen that diode D4 will operate as a transistor instead of a diode if it is improperly biased. If the voltage at node "a" is allowed to go low enough to forward bias the P+/N junction while Q3 is turned on and supplying an ample current, then the substrate 10 P region can act as a collector and the diode junction turns into a base/emitter junction. This problem can be avoided by ensuring that node "a" is connected to $V_{dd}$ by a low on /PRECH before node "b" is connected to $V_{dd}$ by a low on /CLEAR. This constraint is satisfied by the control signal timing described in connection with FIG. 2 above.

Figure 1C:
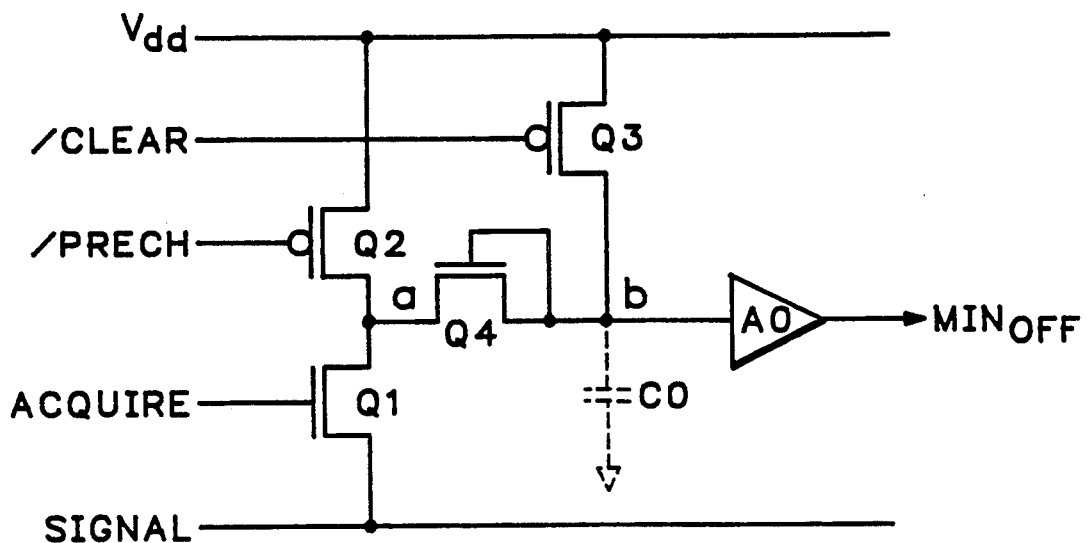
Figure 1D:
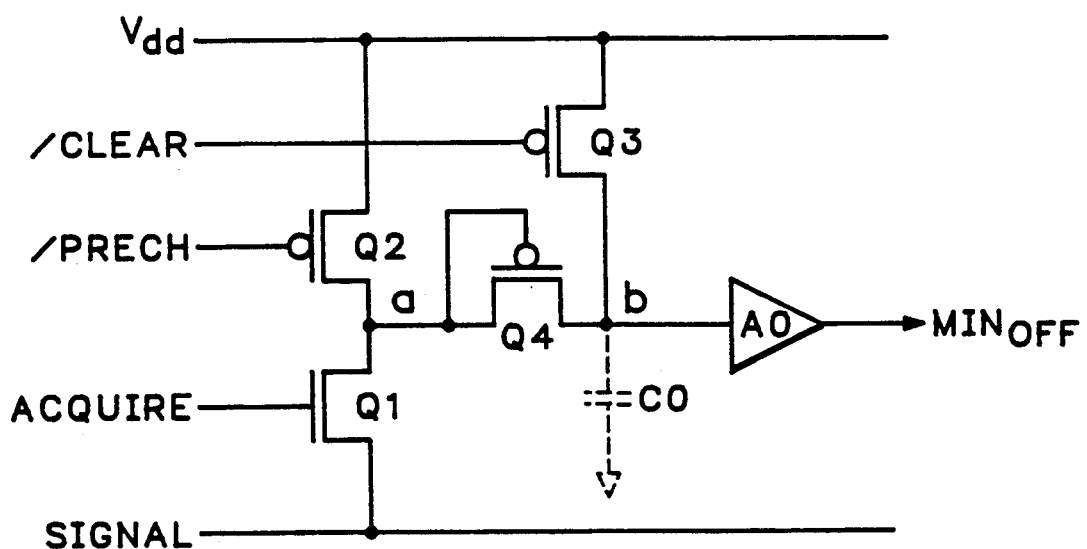

Referring now to FIGS. 1C and 1D, the diode function of D4 in FIG. 1B can be fulfilled using a diode connected transistor, as shown in these Figures. FIG. 1C shows Q4 as a diode-connected NMOS transistor with its gate and drain tied together and connected to node "b". FIG. 1D shows Q4 as a diode-connected PMOS transistor with its gate and source tied together and connected to node "a". In both arrangements node "b" follows node "a" down in voltage but not back up. In each case node "b" stores the lowest value of node "a" plus approximately 1.0 Volts. The operation of both circuits is the same as is shown in FIG. 2.

Figure 4:
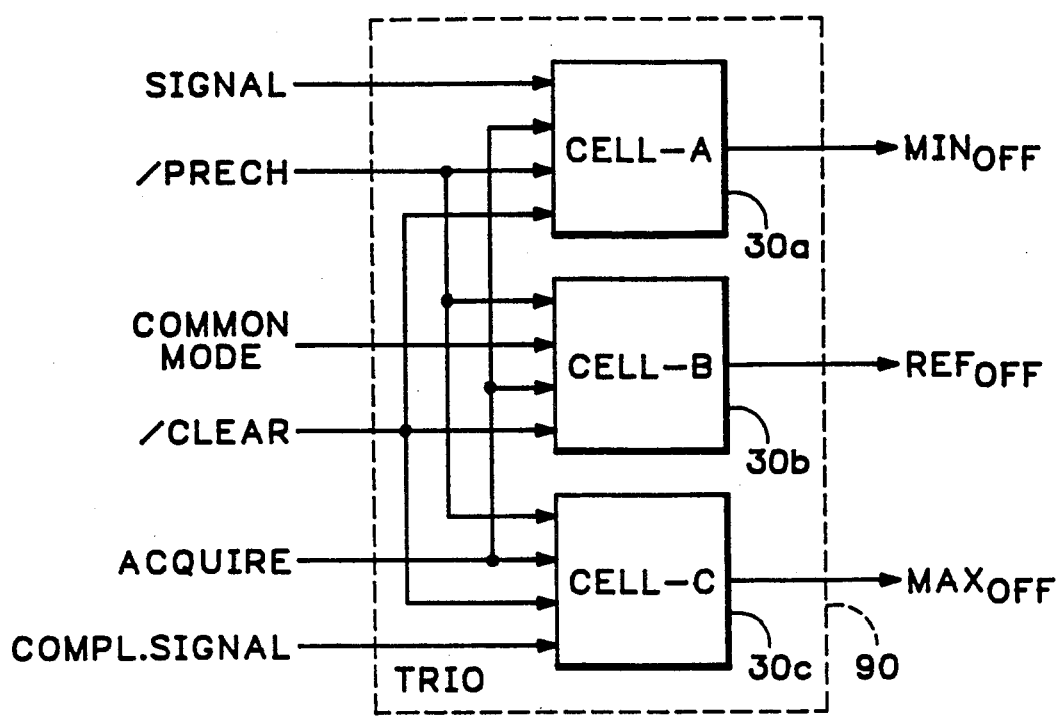
FIG. 4 is a block diagram of a trio of $MIN_{OFF}$ detection cells organized to acquire $MIN_{OFF}$, $REF_{OFF}$, and $MAX_{OFF}$, data associated with one signal.

Referring now to FIG. 4, in one practical application in which complementary differential ECL signals are analyzed, the MIN detection Cells 30 of the present invention are used in "Trios" 90, with Cell-A 30a monitoring one of a pair of complementary signals, Cell-C 30c monitoring the complement of that signal, and Cell-B 30b monitoring a common mode line associated with this differential pair of signals. Each Cell-X 30x receives the /PRECH, /CLEAR, and ACQUIRE signals necessary to make it operate as shown in FIG. 2. Cell-C 30c produces a MAX$_{OFF}$ signal by finding a MIN$_{OFF}$ for INV.SIGNAL, which is the complement of SIGNAL.

Because the COMMON MODE signal associated with SIGNAL and INV.SIGNAL has a constant level, its minimum and maximum are the same. Nonetheless, it is necessary to acquire it because it is processed through virtually the same data path as the signals associated with it, and therefore reflects their common mode behavior despite the noise that all of these signals have experienced. The MIN$_{OFF}$ of the COMMON MODE signal is approximately equal to its constant value plus the 1 Volt offset produced by the cells, and its output can serve as an offset reference, REF$_{OFF}$.

In practice, each acquisition cell is calibrated by writing in and reading out signals of known voltage levels and developing calibration data. This data is then used to generate the contents of a lookup table that is used to convert acquired data into calibrated output, as is well known in the art.

Figure 5A:
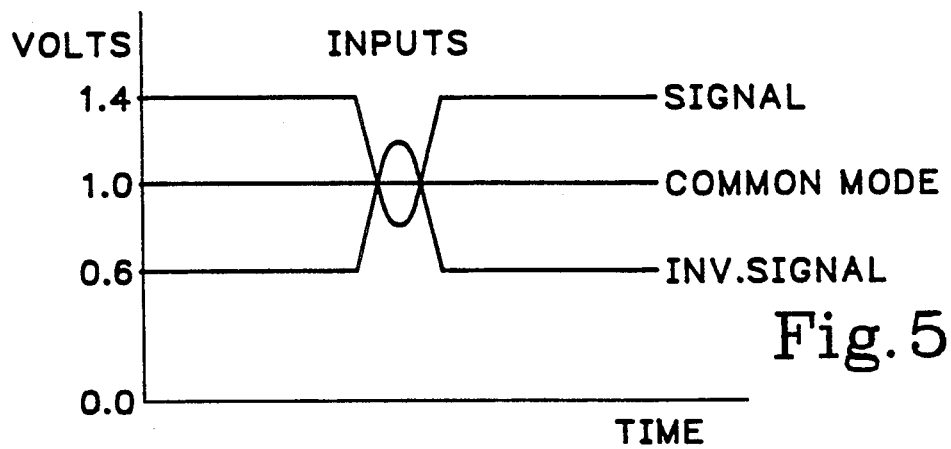
FIGS. 5A and 5B are voltage-versus-time diagrams showing, respectively, the inputs and outputs of the trio of detection cells shown in FIG. 4.
Figure 5B:
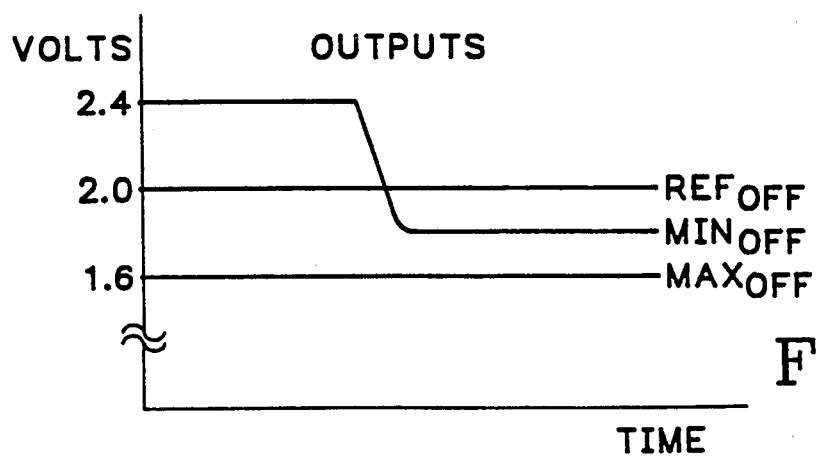

FIGS. 5A and 5B show, respectively, an example of the signal inputs and outputs of the three Cells 30x shown in FIG. 4. The glitch shown in the complementary signals SIGNAL and INV.SIGNAL is assumed to occur within an acquisition interval of the cells in question. The output signal MAX$_{OFF}$ is the minimum of the INV.SIGNAL input to Cell-C 30c offset by the approximately 1 Volt threshold voltage of Q4 (FIG. 1A). Since INV.SIGNAL never goes below 0.6 Volts, MAX$_{OFF}$ is constant at 1.6 Volts. The output signal REF$_{OFF}$ is constant at 2.0 Volts, reflecting the constant level of the COMMON MODE signal at 1.0 Volts. The output signal MIN$_{OFF}$ starts out at 2.4 Volts, reflecting the initial voltage level of SIGNAL at 1.4 Volts, but it changes to 1.8 Volts and stays there at the time that the negative going glitch on SIGNAL causes its level to temporarily drop to 0.8 Volts. MIN$_{OFF}$ then stays at that 1.8 Volt level holding the lowest value of the SIGNAL voltage plus the 1.0 Volt offset.

Figure 6:
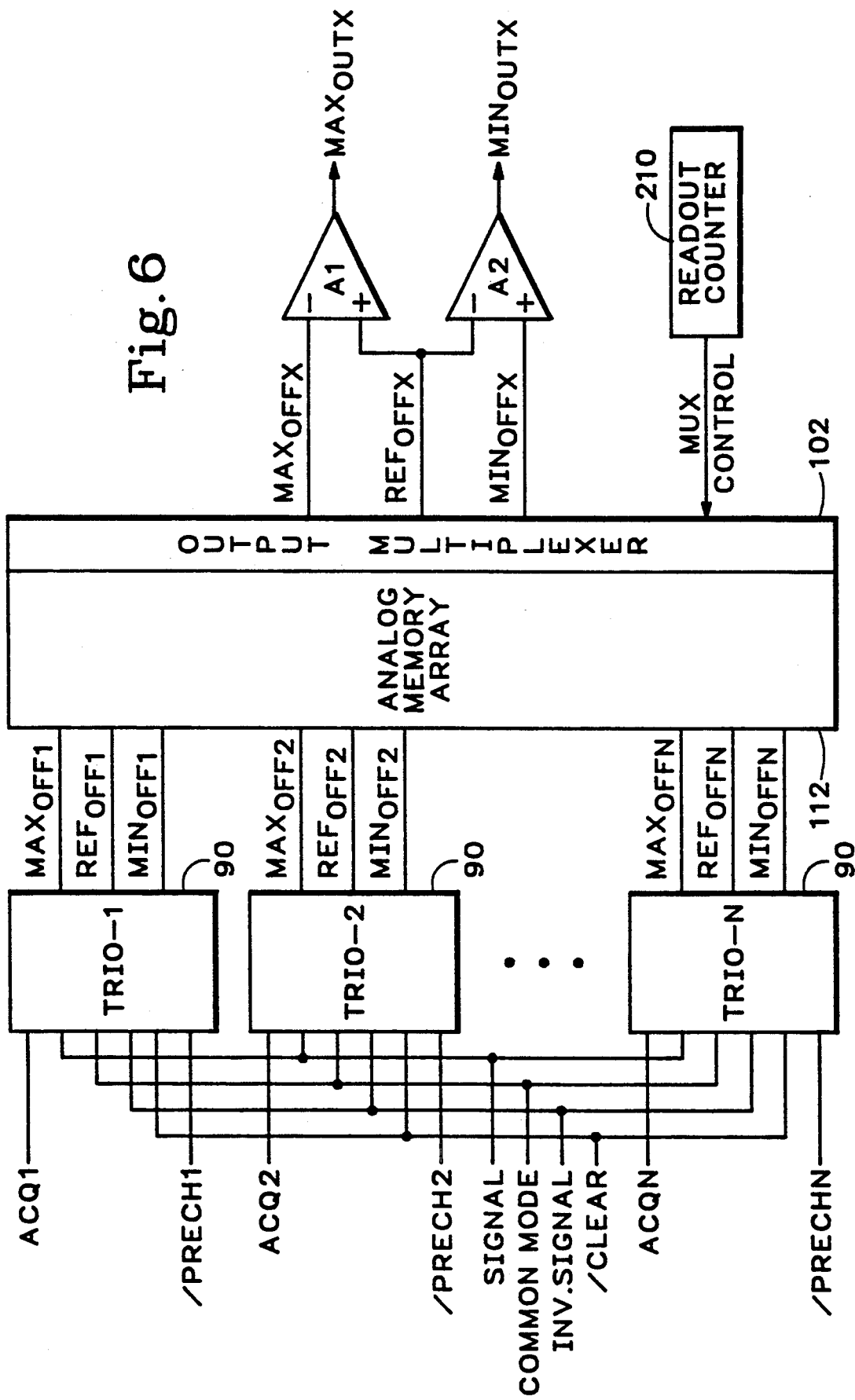
FIG. 6 is a block diagram of max/min detection circuitry employing multiple trios of minimum detection cells.

The actual minimum signal, MIN, can now be determined by subtracting REF$_{OFF}$ from MIN$_{OFF}$, i.e., 1.8 Volts minus 2.0 Volts equals −0.2 Volts. And, similarly, the actual maximum signal, MAX, can now be determined by subtracting MAX$_{OFF}$ from REF$_{OFF}$, i.e., 2.0 Volts minus 1.6 Volts equals +0.4 Volts. FIG. 6 shows a circuit which sequentially samples the output of a row of acquisition trios and performs the MIN and MAX calculations just described.

Referring to FIG. 6, TRIOs 1−N 90 each receive as inputs the SIGNAL being monitored, its complement INV.SIGNAL, the COMMON MODE signal associated with that pair of signals, a /CLEAR signal, and ACQ and /PRECH signals 1−N, respectively. The outputs of each TRIO, MAX$_{OFFx}$, REF$_{OFFx}$, and MIN$_{OFFx}$ (where x represents the TRIO number) are transferred to an analog memory array 112, similar to that shown in the 07/589,222 application, FIGS. 20 and 22. (The vertical axis of FIG. 6 corresponds to the horizontal axis of FIG. 20 of the Ser. No. 07/589,222 application.) The analog memory array 112 provides inputs to a set of multiplexers 102 under the control of a readout counter 210. The set of multiplexers 102 is controlled to MIN$_{OFFx}$ signals as inputs to differential amplifiers A1 and A2. Amplifier A1 has as its positive input the REF$_{OFFx}$ signal and as its negative input the MAX$_{OFFx}$ signal, and produces as its output their difference, MAX$_{OFFx}$. Amplifier A2 has as its positive input MIN$_{OFFx}$ and as its negative input REF$_{OFFx}$, and produces as its output their difference, MIN$_{OUTx}$.

Figure 7:
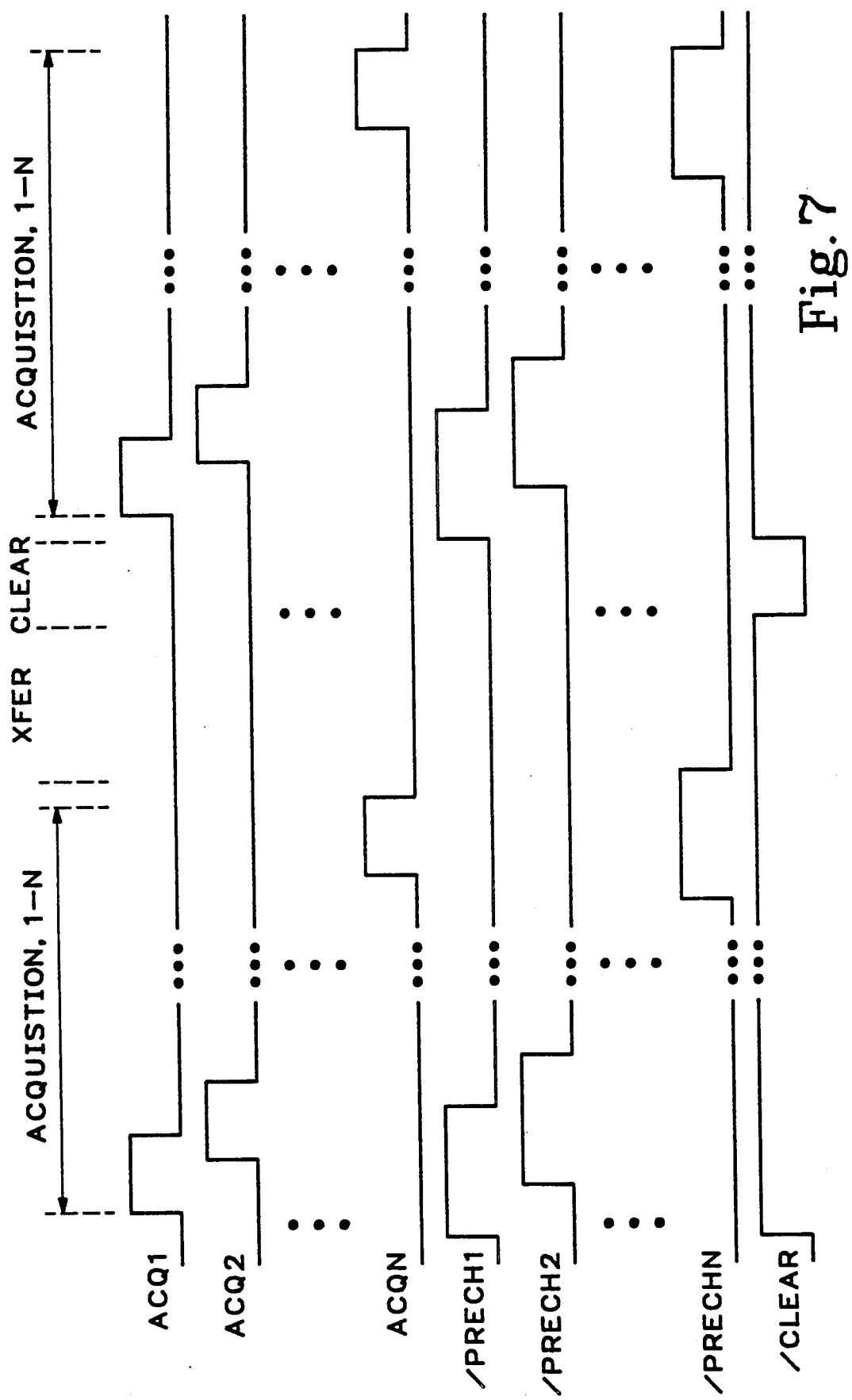
FIG. 7 is a timing diagram illustrating the operation of the max/min detection circuitry shown in FIG. 6.
Figure 8A:
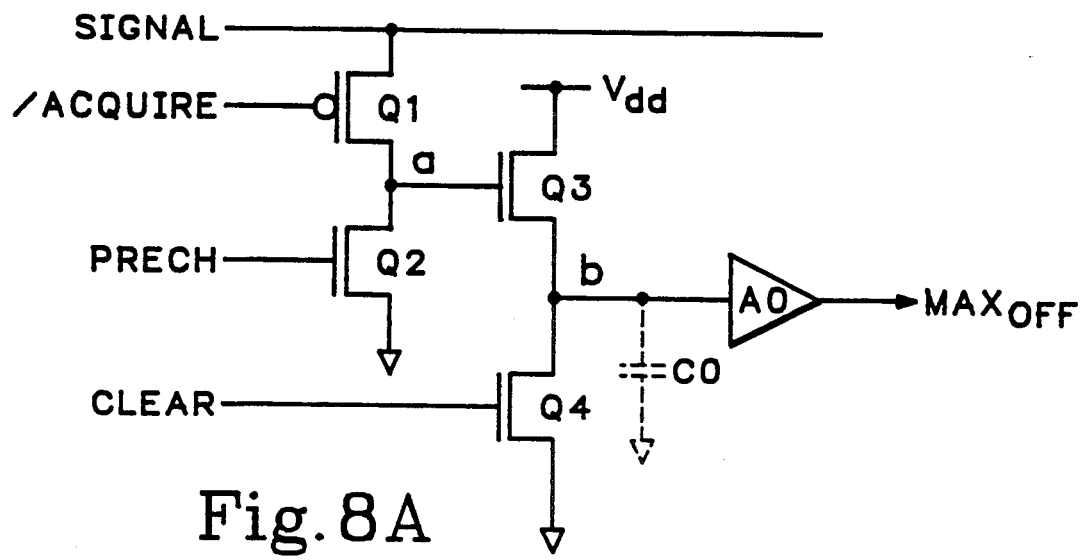
FIGS. 8A–8D are schematic diagrams of four versions of $MAX_{OFF}$ detection cell circuits according to the present invention.
Figure 8B:
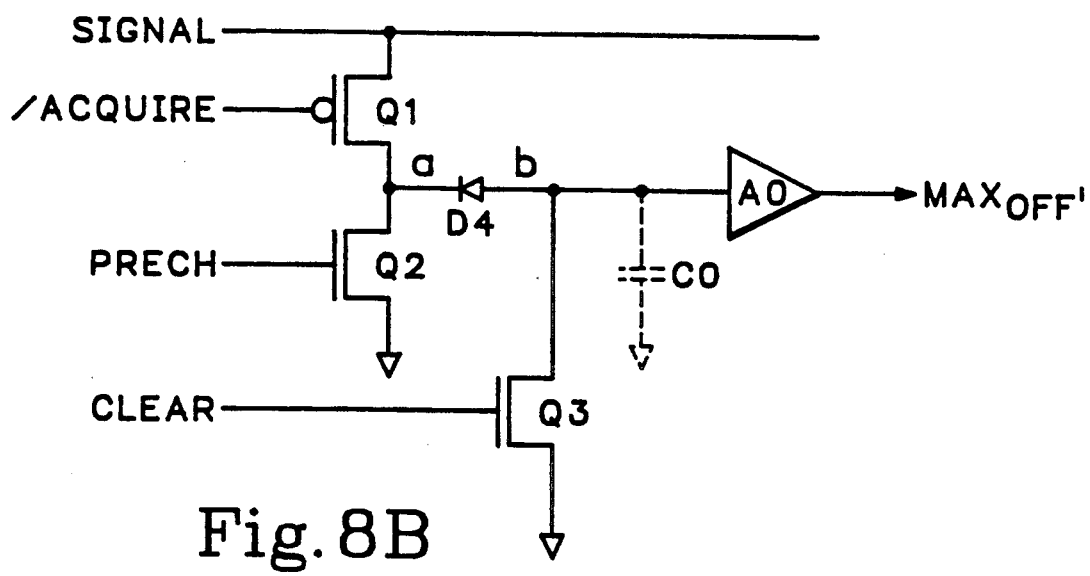
Figure 8C:
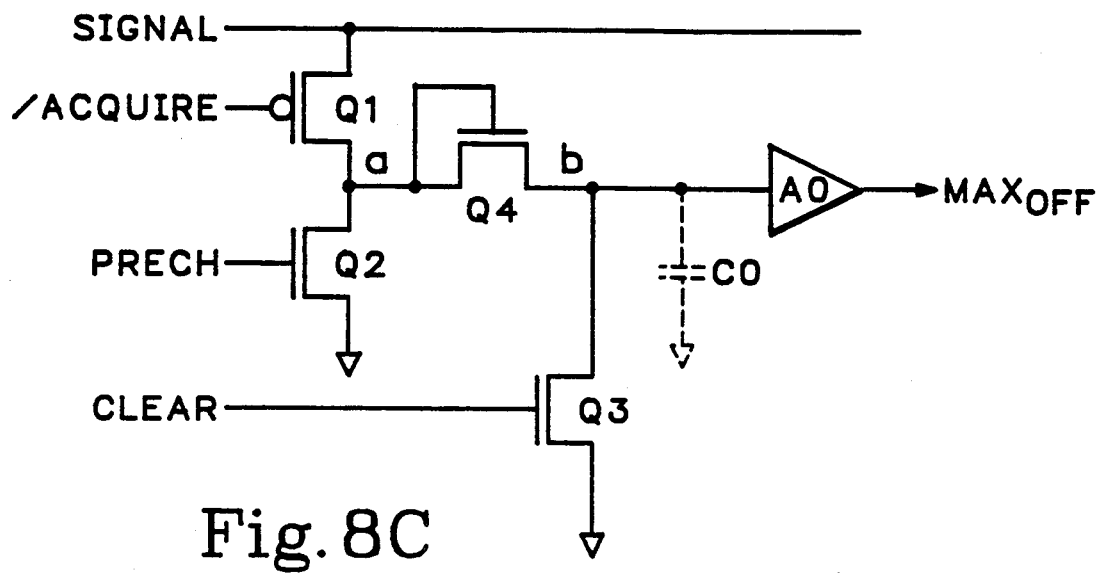
Figure 8D:
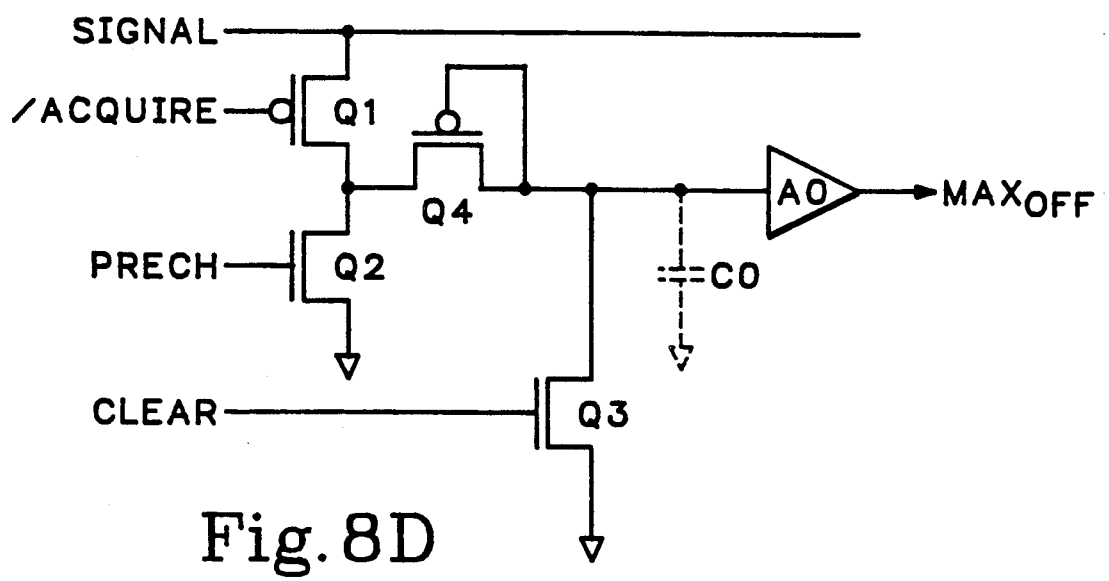

Referring now to FIG. 7, the ACQ1 through ACQN, /PRECH1 through /PRECHN, and /CLEAR signal inputs to the circuitry shown in FIG. 6 have the relative timing shown in this diagram. Note that the /PRECHx signals go high slightly before the corresponding ACQx signals and remain high slightly longer. This ensures that the precharging process will not interfere with the min/max acquisition process. Also note that there is some overlap between one ACQx signal and the next ACQx+1 signal, thus ensuring that no glitch will go undetected. The /CLEAR signal remains inactive high during the active period of all of the /PRECH signals and through a transfer period following the last acquisition period. /CLEAR then goes low to ready all of the MIN$_{OFF}$ detection cells for the next cycle of activity by precharging their "b" nodes (see FIG. 1A). The transfer interval shown in FIG. 7 is used to move a row of acquired min/max data values into corresponding locations within the analog memory array 112.

The Cell 30 circuits shown in FIGS. 1A–1D are ideal for finding minimums of signals in the range of 0.5 Volts to 1.5 Volts, i.e., +/− 0.5 Volt signals symmetrically disposed around a common mode voltage of 1.0 Volts. A maximum detector would have the polarity of each CMOS device opposite from the devices shown here for a minimum detector. Such a circuit would operate best much closer to $V_{dd}$, e.g., in the 3.5 Volt to 4.5 Volt range. Since, in the oscilloscope field it is generally more convenient to work with small signals, maximum detection can be accomplished by detecting minimums in the complementary signal. This is convenient because signals are generally already available in complementary differential ECL form.

For those circumstances where direct signal maximum detection is required, FIGS. 8A through 8D show circuits for determining signal maximums that are analogous to the corresponding minimum finding circuits shown in FIGS. 1A through 1D. The difference between these maximum finding circuits and their corresponding counterpart minimum finding circuits is that the polarities of every transistor, diode, diode-connected transistor, and control signal are reversed, and nodes "a" and "b" are precharged and cleared to ground instead of $V_{dd}$. The analog signal range is now close to $V_{dd}$ instead of ground, e.g., 3.5 to 4.5 Volts instead of 0.5 to 1.5 Volts. And, because Q1 is now PMOS instead of NMOS, these circuits are not as fast as their minimum finding counterparts. The timing still operates as described in connection with FIG. 2, except that the control signals are of opposite polarity, as previously mentioned.

The minimum detection circuits described above are quite effective for high speed operation, in that they respond rapidly. However, when they are used with long sample intervals before the sample-to-hold transition of the ACQUIRE signal, all of these circuits suffer from a problem with sub-threshold currents. During short intervals, a charge on node "b" reflects the charge on node "a" with an *approximation that is always less* than the voltage level on node "a" plus the threshold of the transistor or diode. However, as time passes with the signal on node "a" being close to the voltage threshold for changing the charge on node "b", sub-threshold current leakage changes the voltage present on node "b", causing it to *asymptotically approach* the *exact* value of the node "a" voltage plus the threshold. Since the actual behavior of the signal during this long sample interval is unknown and the magnitude of this effect varies with this unknown behavior of the signal, exact calibration and accuracy becomes impossible.

Figure 9:
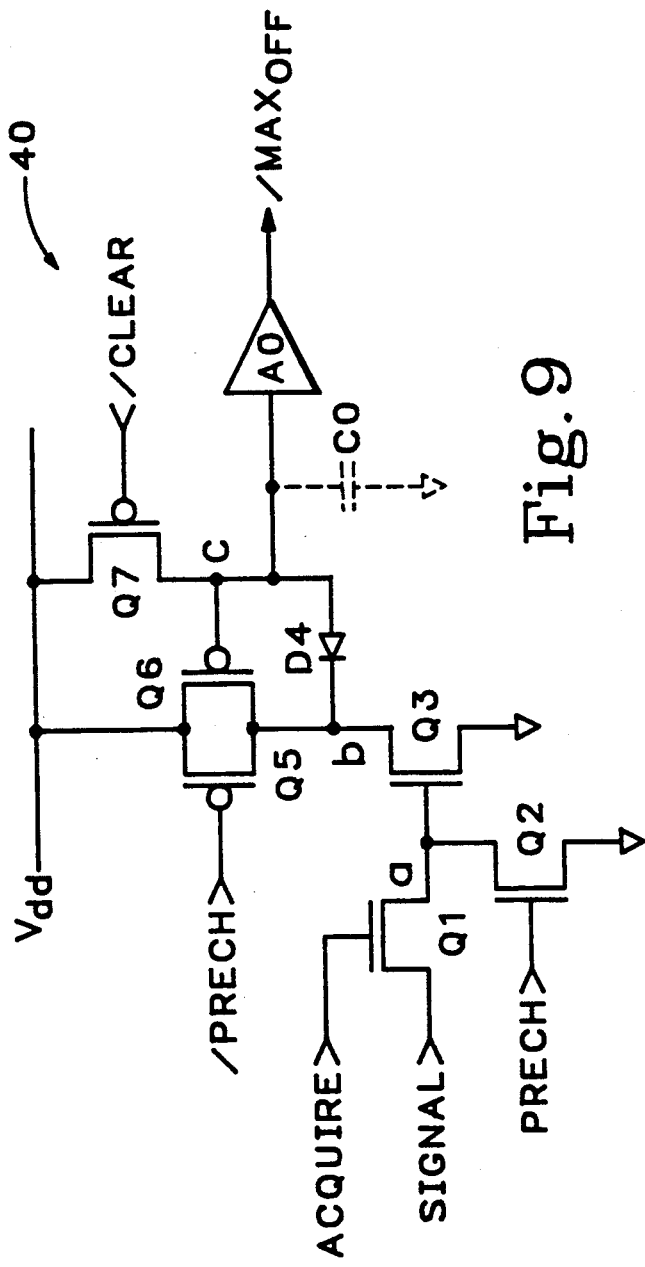
FIG. 9 is a schematic diagram of a /$MAX_{OFF}$ detection cell according to the present invention that is suitable for use with long acquisition windows.

Referring now to FIG. 9, this problem can be overcome with a more complex version of the max/min detection cell. This version of the circuit is inherently slower, and so it doesn't perform as well at high frequencies, but for slower signals it is more reliable in that it is less affected by sub-threshold current problems. This circuit includes another node, "c", and additional circuitry to ensure the isolation of this node from the affects of sub-threshold currents.

In the circuit of FIG. 9, the SIGNAL to be monitored is applied to the source of NMOS transistor Q1. The drain of Q1 is connected to node "a" and its gate is controlled by an ACQUIRE signal. A PRECH signal controls the gate of another NMOS transistor, Q2, whose source is connected to ground and whose drain is connected to node "a". Node "a" controls the gate of another NMOS transistor, Q3, whose source is connected to ground and whose drain is connected to node "b". Node "b" is connected to the drain of two PMOS transistors, Q5 and Q6, whose drains are both connected to $V_{dd}$. The gate of Q5 is controlled by /PRECH, while the gate of Q6 is controlled by node "c". A diode D4 connects node "b" to node "c", with its orientation permitting conduction when node "b" goes more than one junction drop below node "c". Node "c" is connected to the input of an amplifier A0 that has an input capacitance C0. Node "c" is also connected to the source of another PMOS transistor Q7, whose drain is connected to $V_{dd}$ and whose gate is controlled by a /CLEAR signal. The output of the circuit is the output of the amplifier A0, /MAX$_{OFF}$, a signal inversely related to the maximum excursion of the SIGNAL.

Figure 10:
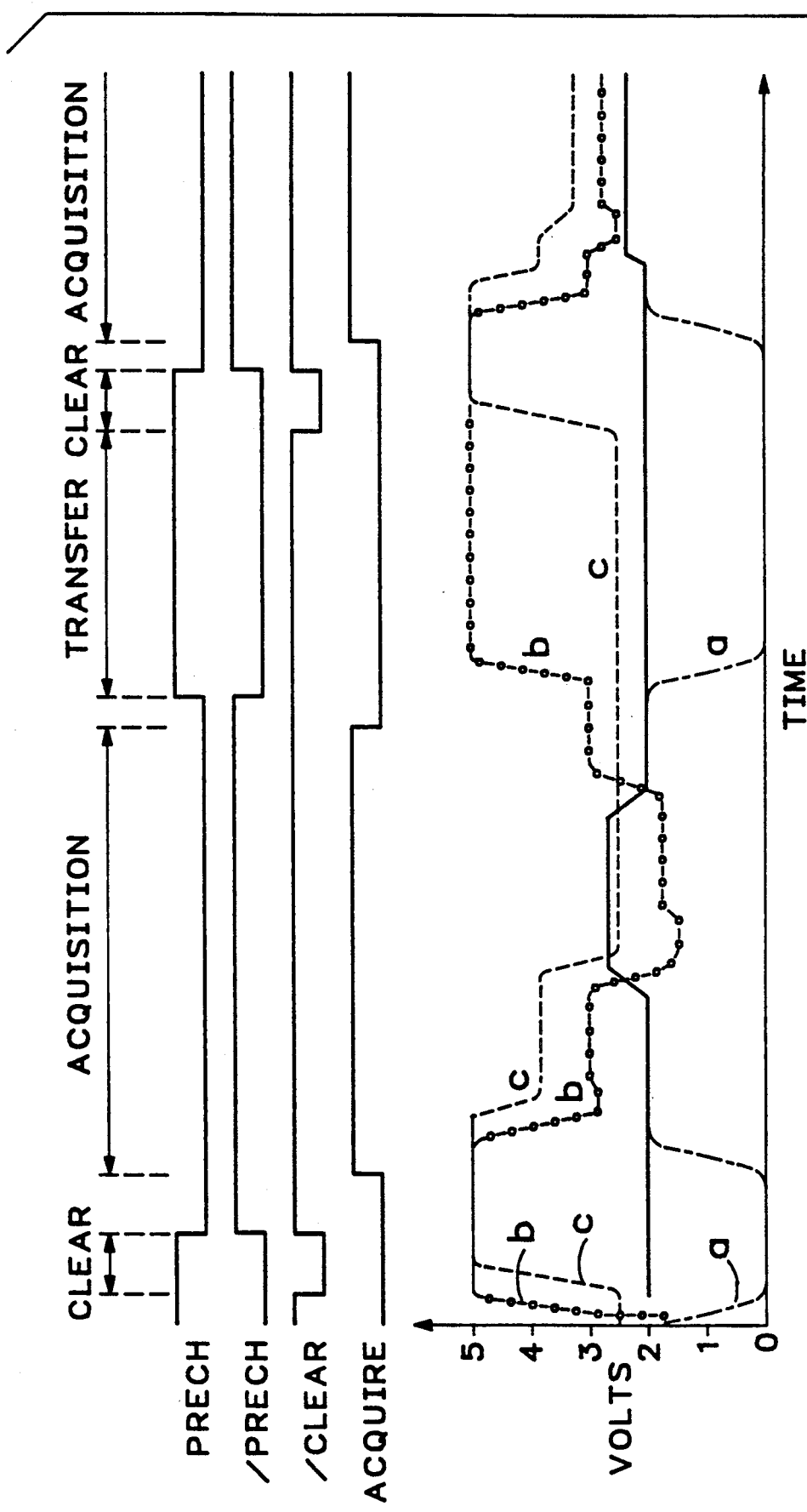
FIG. 10 is a timing diagram illustrating the operation of the circuit shown in FIG. 9.

Referring now to FIG. 10, as well as FIG. 9, the operation of this slower but more resistance to sub-threshold currents circuit, or slow cell 40, will now be explained. While PRECH is high and /PRECH is low, /CLEAR goes low. At this time, Q2 is conducting and connecting node "a" to ground, Q5 is conducting and connecting node "b" to $V_{dd}$, and Q7 is conducting and connecting node "c" to $V_{dd}$. PRECH, /PRECH, and /CLEAR then all change state, isolating node "a" and leaving it discharged to 0 Volts, isolating nodes "b" and "c" and leaving them precharged to $V_{dd}$.

Following this preparatory activity, ACQUIRE goes high, connecting the SIGNAL to be monitored to node "a". The voltage on node "a" causes Q3 to conduct, which in turn starts node "b" discharging. When node "b" gets more than one diode junction drop below $V_{dd}$, diode D4 begins to conduct, causing node "c" to follow node "b" down. As node "c" goes down to about a volt below $V_{dd}$ it begins to turn on Q6, causing a current to flow through Q6 and Q3. This current creates a voltage divider between the resistances of Q6 and Q3 and increases the voltage present at node "b". There is some delay around the loop from node "b" through however, and so by the time equilibrium is reached node "b" D4 to node "c" and back around through Q6 to node "b", however, and so by the time equilibrium is reached node "b" has overshot and recovered, leaving the voltage difference between nodes "b" and "c" at 100 to 200 mV less than a full diode junction drop. The beneficial result of this behavior is that the sub-threshold current through diode D4 is dramatically reduced and therefore the voltage level stored on node "c" is not corrupted with the effects of sub-threshold current leakage.

After the end of the acquisition interval, PRECH goes high turning on Q2 and discharging node "a" to ground. At the same time /PRECH goes low turning on Q5 and precharging node "b" to $V_{dd}$. Node "c" is left isolated at the stored voltage level that represents the inverse of the maximum voltage level of the SIGNAL to be monitored. Amplifier A0 produces this voltage level, /MAX$_{OFF}$ at the output of the circuit, where it is transferred to other circuitry before node "c" is again precharged to $V_{dd}$ by the next /CLEAR signal.

The diode D4 in FIG. 9 replaced by diode-connected transistors, as shown in FIGS. 1C and 1D. And, the polarity of all of the transistors and control signals can be reversed to cause the slow cells to detect /MIN$_{OFF}$ rather than /MAX$_{OFF}$, as was illustrated by the differences between the circuits shown in FIGS. 1A–1D and those shown in FIGS. 8A–8D.

Since long hold windows can cover more signal activity, it is generally not necessary to have as many of these slow cells 40 as the fast cells 30 described previously. Therefore, providing a limited number of these slower but more accurate cells on the same integrated circuit with a larger number of the faster ones provides a cost effective combination that can be suitably configured for either fast or slow min/max detection. The circuit arrangements shown in FIGS. 4 and 6 are also appropriate for use with the slower cells 40.

Figure 11:
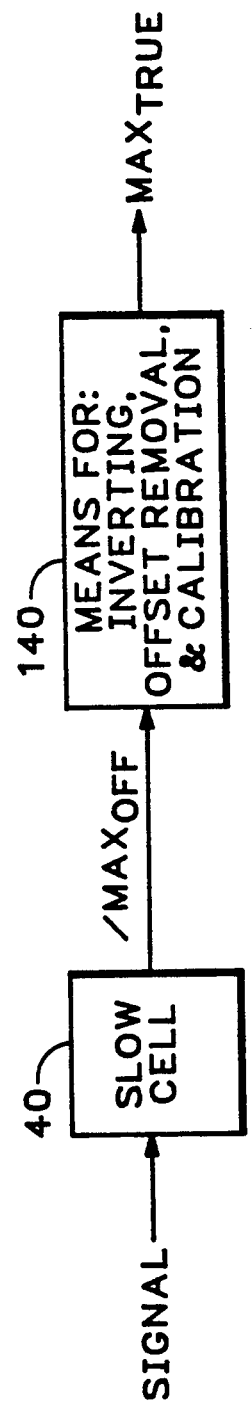
FIG. 11 is a simplified block diagram showing how the output of the circuit shown in FIG. 9 may be further processed.

Referring now to FIG. 11, the output /MAX$_{OFF}$ of one of these slow cells 40 may be processed further by means 140 for inverting, offset removal, and calibration, to produce a true maximum signal, MAX$_{TRUE}$. One means of performing all three of these functions simultaneously is a memory-based lookup table, as is well known in the art.

While some preferred embodiments of the present invention have been shown and descried, it will be apparent to those skilled in the art that many changes and modifications may be made without departing from the invention in its broader aspects. The claims that follow are therefore intended to cover all such changes and modifications as fall within the true scope of the invention.

I claim:

1. A method for detecting a minimum voltage value of a signal to be monitored during a time interval, comprising the steps of:

precharging a first node and a second node to a voltage level higher than a voltage range of the signal to be monitored;

connecting the first node to the signal to be monitored during the time interval so that a voltage level of the first node follows a voltage level of the signal to be monitored; and causing the second node to discharge according to the voltage level of the first node to produce an output signal indicative of the minimum voltage level of the signal to be monitored during the time interval.

2. A method according to claim 1 wherein the causing step comprises the step of:

discharging the second node to the voltage level of the first node plus an offset so a final voltage level of the second node at an end of the time interval is indicative of a lowest voltage level of the first node plus the offset to produce the output signal indicative of the minimum voltage level of the signal during the time interval.

3. A method according to claim 2 further comprising the step of:

removing the offset from the final voltage level of the second node so that the output signal is approximately equal to the minimum voltage level of the signal to be monitored during the time interval.

4. A method for determining a minimum voltage level and a maximum voltage level of a differential signal to be monitored, the differential signal including a signal, a complement of the signal, and a common mode signal, the method comprising the steps of:

determining a minimum voltage level of the signal during a time interval to produce a min signal with an offset;

determining a minimum voltage level of the complement of the signal during the time interval to produce a max signal with the offset;

determining a minimum voltage level of the common mode signal during the time interval to produce a ref signal with the offset;

subtracting the max signal with the offset from the ref signal with the offset to obtain a maximum signal level of the signal during the time interval; and subtracting the ref signal with the offset from the min signal with the offset to obtain a minimum signal level of the signal during the time interval.

5. A method according to claim 4 wherein the determining steps each comprise the steps of:

precharging a first node and a second node to a voltage level higher than a voltage range of the signal;

connecting the first node to the signal during the time interval so that a voltage level of the first node tracks a voltage level of the signal; and causing the second node to discharge according to the voltage level of the first node plus an offset to produce an output signal indicative of a determined minimum voltage.

6. A method according to claim 4 further comprising the step of:

repeating the three determining steps and the two subtracting steps a plurality of times for overlapping successive intervals of time.

7. A method according to claim 6 further comprising the steps of:

transferring out the obtained maximum and minimum signal levels of the signal during the plurality of times; and re-doing the repeating step and the transferring step an additional plurality of times.

8. A method according to claim 5 further comprising the step of:

repeating the three determining steps and the two subtracting steps a plurality of times for overlapping successive intervals of time.

9. A method according to claim 8 further comprising the steps of:

transferring out the obtained maximum and minimum signal levels of the signal during the plurality of times and re-doing the repeating step and the transferring step an additional plurality of times.

10. A circuit for determining a minimum voltage level of a signal to be monitored during a time interval comprising:

means for precharging first and second nodes to a reference voltage level that is higher than all expected voltage levels of the signal to be monitored;

means for connecting the first node to the signal to be monitored during the time interval;

means for discharging the second node in response to voltage changes of the first node; and means for determining the voltage level of the second node after the time interval.

11. A circuit according to claim 10 wherein the means for precharging comprises:

a first switch for making electrical connection between a power source and the first node during a precharge interval and a readout interval; and a second switch for electrically connecting the second node to the power source during the precharge interval.

12. A circuit according to claim 10 wherein the means for connecting comprises:

a switch under the control of an acquire signal the acquire signal being active during the time interval.

13. A circuit according to claim 10 wherein the means for discharging comprises:

a PMOS transistor having its gate connected to the first node and its drain connected to the second node.

14. A circuit according to claim 10 wherein the means for determining comprises:

a buffer amplifier.

15. A method for detecting a maximum voltage value of a signal to be monitored during a time interval, comprising the steps of:

discharging a first node to ground and precharging a second node and a third node to a voltage level higher than a voltage range of the signal to be monitored;

connecting the first node to the signal to be monitored during the time interval so that a voltage level of the first node follows a voltage level of the signal to be monitored;

causing the second node to discharge according to the inverse of the voltage level of the first node and feedback from the third node;

changing a voltage level of the third node according to the voltage level of the second node and a device threshold;

supplying feedback from the third node to the second node with a slight delay, so that overshoot of the second node is corrected, the correction of the overshoot reducing the difference between the voltage level of the second node and the voltage level of the third node to less than the device threshold and thereby reducing sub-threshold current leakage between the second and third nodes; and producing the voltage level of the third node as an inverse offset maximum voltage value of the signal to be monitored.

16. A method according to claim 15 comprising the further step of converting the inverse offset maximum voltage value to a true maximum value.

17. A method according to claim 16 wherein the converting step comprises the steps of:
inverting the inverse offset maximum voltage value to produce an offset maximum voltage value;
removing the offset to produce a maximum voltage value; and
applying calibration factors to the maximum voltage value to produce a true maximum voltage value.

18. A method according to claim 16 wherein the converting step comprises the step of using the inverse offset maximum voltage values as addresses to look up true maximum values in a memory.

19. A circuit for determining a maximum voltage level of a signal to be monitored during a time interval comprising:
means for discharging a first node and for precharging second and third nodes to a reference voltage level;
means for connecting the first node to the signal to be monitored during the time interval so that a voltage level of the first node follows a voltage level of the signal to be monitored;
means for causing the second node to discharge according to the inverse of the voltage level of the first node and feedback from the third node;
means for changing a voltage level of the third node according to the voltage level of the second node and a device threshold;
means for supplying feedback from the third node to the second node with a slight delay, so that overshoot of the second node is corrected, the correction of the overshoot reducing the difference between the voltage level of the second node and the voltage level of the third node to less than the device threshold and thereby reducing subthreshold current leakage between the second and third nodes; and
means for producing the voltage level of the third node as an inverse offset maximum voltage value of the signal to be monitored.

20. A circuit according to claim 19 wherein the means for discharging and precharging comprises:
a first switch for making electrical connection between ground and the first node during a precharge interval;
a second switch for electrically connecting the second node to a power source during the precharge interval; and
a third switch for electrically connecting the third node to the power source during a clear interval.

21. A circuit according to claim 19 further comprising means for converting the inverse offset maximum voltage value to a true maximum value.

22. A method according to claim 21 wherein the means for converting comprises:
means for inverting the inverse offset maximum voltage value to produce an offset maximum voltage value;
means for removing the offset to produce a maximum voltage value; and
means for applying calibration factors to the maximum voltage value to produce a true maximum voltage value.

23. A circuit according to claim 21 wherein the means for converting comprises a lookup memory addressed by the inverse offset maximum voltage values and containing true maximum values at the corresponding addresses.

* * * * *